(12) United States Patent
Nakatani

(10) Patent No.: US 8,975,714 B2
(45) Date of Patent: Mar. 10, 2015

(54) CAPACITIVE PRESSURE SENSOR AND METHOD OF MANUFACTURING THE SAME

(71) Applicant: Rohm Co., Ltd., Kyoto (JP)

(72) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 129 days.

(21) Appl. No.: 13/757,701

(22) Filed: Feb. 1, 2013

(65) Prior Publication Data

US 2013/0193534 A1 Aug. 1, 2013

(30) Foreign Application Priority Data

Feb. 1, 2012 (JP) .................................. 2012-20184

(51) Int. Cl.
| | | |
|---|---|---|
| *G01L 9/12* | (2006.01) | |
| *B81B 3/00* | (2006.01) | |
| *G01L 1/14* | (2006.01) | |
| *H01L 21/311* | (2006.01) | |
| *B81C 1/00* | (2006.01) | |
| *G01L 9/00* | (2006.01) | |

(52) U.S. Cl.
CPC .............. *G01L 1/148* (2013.01); *H01L 21/311* (2013.01); *B81C 1/00047* (2013.01); *G01L 9/0073* (2013.01); *G01L 9/0045* (2013.01); *B81B 2201/0264* (2013.01)
USPC ......... 257/419; 438/53; 257/E29.324; 73/724

(58) Field of Classification Search
CPC .............. B81B 2201/0264; B81B 2203/0127; B81B 3/0021; B81B 3/0018; B81B 2203/0315; G01L 9/0042; B81C 1/00182
USPC ................. 257/419, E29.324; 438/53; 73/724
See application file for complete search history.

(56) References Cited

U.S. PATENT DOCUMENTS

| | | | | |
|---|---|---|---|---|
| 5,531,121 | A * | 7/1996 | Sparks et al. .................... | 73/716 |
| 6,573,154 | B1* | 6/2003 | Sridhar et al. ................ | 438/430 |
| 7,998,776 | B1* | 8/2011 | Li et al. ............................ | 438/53 |
| 8,165,324 | B2* | 4/2012 | Feyh et al. ..................... | 381/174 |
| 2001/0049200 | A1* | 12/2001 | Erratico et al. ............... | 438/701 |
| 2005/0017276 | A1* | 1/2005 | Ikushima et al. ............. | 257/293 |
| 2005/0098840 | A1* | 5/2005 | Fuertsch et al. .............. | 257/414 |
| 2005/0142688 | A1* | 6/2005 | Partridge et al. ................ | 438/53 |
| 2006/0057816 | A1* | 3/2006 | Benzel et al. .................. | 438/424 |
| 2008/0224242 | A1* | 9/2008 | Villa et al. ..................... | 257/419 |
| 2010/0044808 | A1* | 2/2010 | Dekker et al. ................. | 257/415 |
| 2011/0147864 | A1* | 6/2011 | Kramer et al. ................ | 257/419 |
| 2011/0221014 | A1* | 9/2011 | Nakatani ....................... | 257/417 |
| 2011/0260297 | A1* | 10/2011 | Lin et al. ....................... | 257/621 |
| 2012/0186354 | A1* | 7/2012 | Okada ............................ | 73/724 |
| 2012/0205653 | A1* | 8/2012 | Nishikage et al. ............. | 257/49 |
| 2013/0062713 | A1* | 3/2013 | Sakuragi et al. .............. | 257/419 |

FOREIGN PATENT DOCUMENTS

| | | |
|---|---|---|
| JP | 2011-146687 A | 7/2011 |
| WO | WO 2011148973 A1 * | 12/2011 |

\* cited by examiner

*Primary Examiner* — Steven J Fulk
(74) *Attorney, Agent, or Firm* — Rabin & Berdo, P.C.

(57) ABSTRACT

A capacitive pressure sensor includes: a semiconductor substrate having a reference pressure chamber formed therein; a diaphragm which is formed in a front surface of the semiconductor substrate and has a ring-like peripheral through hole penetrating between the front surface of the semiconductor substrate and the reference pressure chamber and defining an upper electrode and a plurality of central through holes; a peripheral insulating layer which fills the peripheral through hole and electrically isolates the upper electrode from other portions of the semiconductor substrate; and a central insulating layer which fills the central through holes.

10 Claims, 14 Drawing Sheets

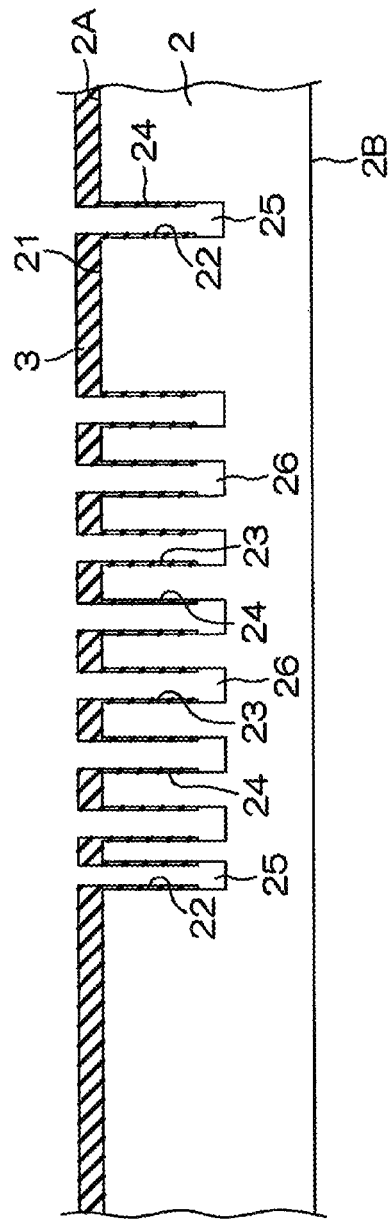

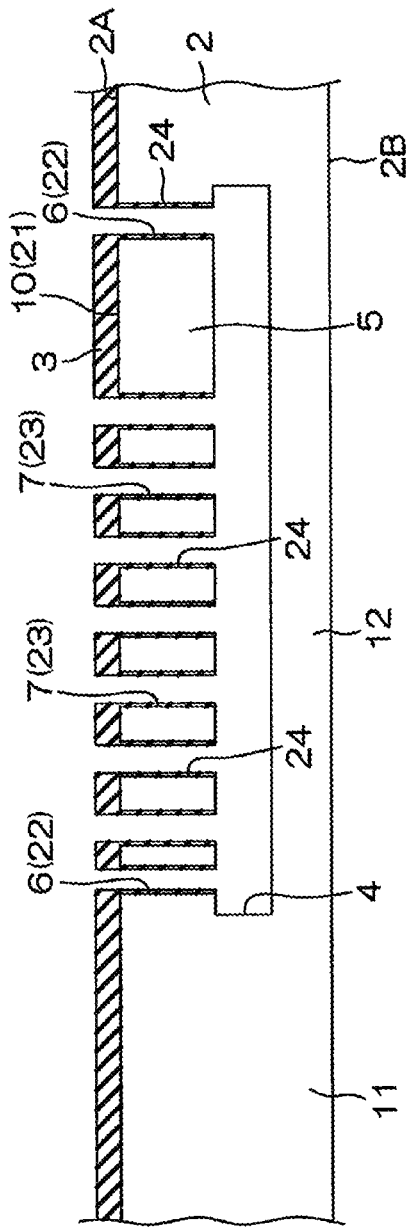

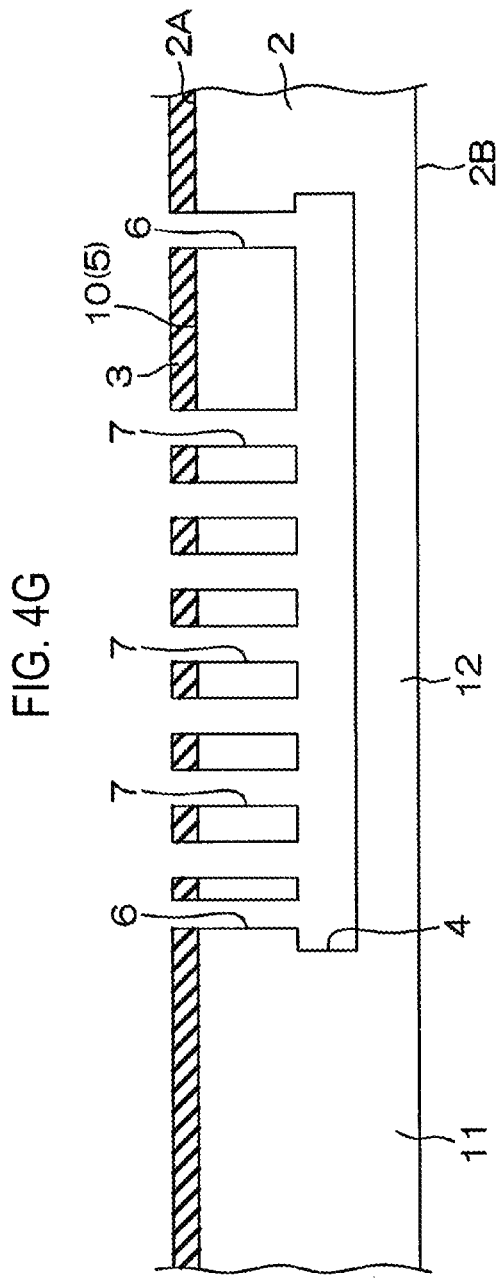

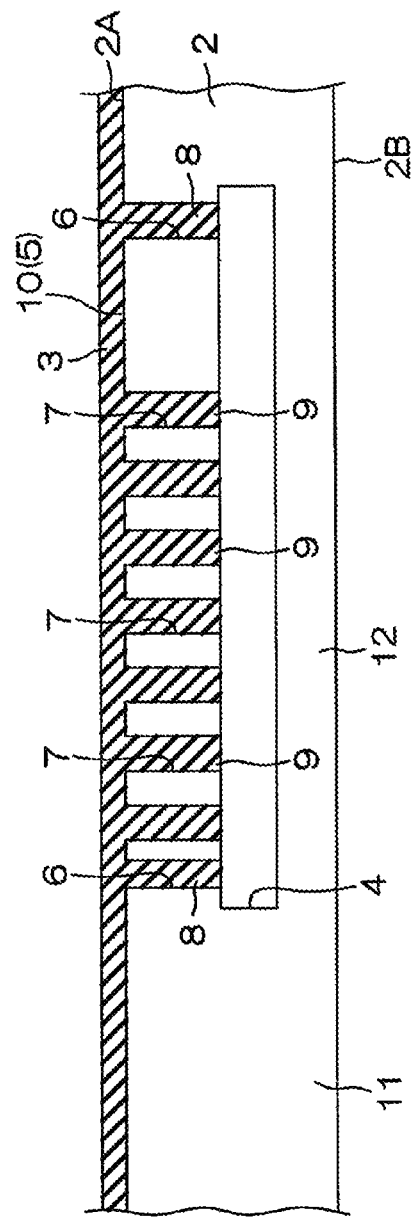

Before thermal oxidation

After thermal oxidation

CAPACITIVE PRESSURE SENSOR AND METHOD OF MANUFACTURING THE SAME

CROSS-REFERENCE TO RELATED APPLICATION(S)

This application is based upon and claims the benefit of priority from Japanese Patent Application No. 2012-20184, filed on Feb. 1, 2012, the entire contents of which are incorporated herein by reference.

TECHNICAL FIELD

The present disclosure relates to a capacitive pressure sensor and a method of manufacturing the same.

BACKGROUND

With the recent wide-spread of smart phones and the like, the use of pressure sensors enabling a sensing operation in a height direction has increased. There has been proposed a piezo-resistive pressure sensor which detects a variation of resistance of a piezo-resistive element as a variation of pressure. For example, there is known a pressure sensor including a base substrate, a cap substrate which is formed therein with a concave portion to define a space between the concave portion and the base substrate by being bonded to the base substrate, a membrane which is formed in the space using a portion of the base substrate, and an impurity diffusion region serving as a pressure sensor element formed in the membrane. In this pressure sensor, the membrane is displaced in response to a pressure applied thereto and a variation of resistance of the impurity diffusion region in response to the displacement is measured to detect the pressure.

However, a piezo-resistive element is susceptible to a change in ambient temperature and is likely to result in a deviation in detection precision under varying ambient temperature. This requires a correction on a pressure detected in the pressure sensor using the piezo-resistive element. In addition, a sensor having a 3D structure with at least two substrates bonded to each other has a problem of high costs and an increased size of the pressure sensor.

SUMMARY

The present disclosure provides some embodiments of a capacitive pressure sensor which is capable of reduced deviation of detection precision, low costs and down-sizing by providing a reference pressure chamber within a single semiconductor substrate. The present disclosure provides some embodiments of a method of manufacturing a capacitive pressure sensor, which is capable of reduced deviation of detection precision, low costs and down-sizing, in a simple and convenient manner.

According to one embodiment of the present disclosure, there is provided a capacitive pressure sensor including: a semiconductor substrate having a reference pressure chamber formed therein and having a front surface at one side of the reference pressure chamber and a rear surface at the other side of the reference pressure chamber; a diaphragm which is formed in the front surface of the semiconductor substrate and has a ring-like peripheral through hole penetrating between the front surface of the semiconductor substrate and the reference pressure chamber and defining an upper electrode constituted by a portion of the diaphragm in its inner side and a plurality of central through holes penetrating between the front surface of the semiconductor substrate and the reference pressure chamber; a peripheral insulating layer which is disposed within the peripheral through hole and fills the peripheral through hole to electrically isolate the upper electrode from other portions of the semiconductor substrate; and a central insulating layer which is disposed within the central through holes and fills the central through holes.

With this configuration, since the upper electrode is electrically isolated from other portions of the semiconductor substrate by the peripheral insulating layer, a capacitor structure can be formed by the upper electrode and the opposing rear surface (lower electrode) of the semiconductor substrate with the reference pressure chamber (cavity) interposed therebetween. When the diaphragm is subjected to a pressure, the diaphragm is deformed due to a difference in pressure between the interior and exterior of the reference pressure chamber, thereby changing a distance between the upper electrode and the lower electrode. As a result, a capacitance between the upper electrode and the lower electrode is changed. The pressure applied to the diaphragm can be detected by detecting the change in capacitance. In this manner, since a piezo-resistive element susceptible to a change in ambient temperature is not used as an element for pressure detection, it is possible to decrease a deviation in detection precision under varying ambient temperature.

In addition, there is no need to define the reference pressure chamber by bonding of two semiconductor substrates, which can result in low costs and down-sizing of the pressure sensor. Preferably, the central through holes are arranged into a water droplet pattern, and the peripheral through hole is formed into a slit shape in which a plurality of dots having the same size as each of the dot-like central through holes constituting the water droplet pattern are interconnected to surround the upper electrode. In this case, the slit-like peripheral through hole may have a wavy contour formed by interconnection of peripherals of the plurality of dots when viewed from the front surface of the semiconductor substrate. In addition, dots may include triangles, squares and other polygonal in addition to circles.

In some embodiments, a semiconductor portion of the upper electrode other than a portion where the central insulating layer is disposed is exposed to a ceiling of the reference pressure chamber. If a surface (bottom) of the upper electrode at the reference pressure chamber side is covered by an insulating film such as silicon oxide, the insulating film is likely to be electrified when the diaphragm is deformed and the upper electrode contacts the rear side (lower electrode) of the semiconductor substrate. However, with the inventive configuration, this problem of electrification can be avoided by exposing the semiconductor portion of the upper electrode to the ceiling of the reference pressure chamber without covering it with an insulating film.

In some embodiments, the semiconductor substrate is made of silicon. Silicon is inexpensive material which can reduce costs required for the semiconductor substrate. When the semiconductor substrate is made of silicon, the central insulating layer and the peripheral insulating layer are preferable to be made of silicon oxide. Preferably, the capacitive pressure sensor further includes: a first wiring connected to the upper electrode; and a second wiring connected to other portion than the upper electrode of the semiconductor substrate. With this configuration, it is possible to provide a capacitive pressure sensor of a simple structure having a front surface and a rear surface of a single semiconductor substrate as an upper electrode and a lower electrode, respectively.

In some embodiments, the interior of the reference pressure chamber is a sealed space. When the interior of the reference pressure chamber is sealed, it is possible to prevent the internal pressure of the reference pressure chamber from being changed due to a change in ambient temperature, which can result in improvement of detection precision of the pressure sensor.

According to another embodiment of the present disclosure, provided is a method of manufacturing a capacitive pressure sensor, including: selectively forming a ring-like peripheral concave portion defining a closed region and a plurality of central concave portions disposed within the closed region in a front surface of a semiconductor substrate made of silicon; forming a protective film made of silicon oxide on each of inner sides of the peripheral concave portion and the central concave portions; selectively removing portions of the protective film on the bottom of the peripheral concave portion and the central concave portions; digging the peripheral concave portion and the central concave portions by anisotropic etching, forming a reference pressure chamber by interconnecting lower portions of the peripheral concave portion and the plurality of central concave portions by isotropic etching and forming a diaphragm including an upper electrode constituted by the closed region in the front surface of the semiconductor substrate disposed in a front surface side with respect to the reference pressure chamber; forming a peripheral insulating layer made of silicon oxide, which fills a peripheral through hole constituted by the peripheral concave portion penetrating between the front surface of the semiconductor substrate and the reference pressure chamber and electrically isolates the upper electrode from other portions of the semiconductor substrate by thermally oxidizing the semiconductor substrate; and forming a central insulating layer made of silicon oxide, which fills central through holes constituted by the central concave portions penetrating between the front surface of the semiconductor substrate and the reference pressure chamber by thermally oxidizing the semiconductor substrate.

With this method, the reference pressure chamber is formed in the semiconductor substrate by making the interior of the semiconductor substrate hollow by means of anisotropic etching and isotropic etching and the peripheral insulating layer and the central insulating layer to seal the reference pressure chamber are formed in the peripheral through holes and the central through holes, respectively. In other words, the reference pressure chamber can be formed only through process such as etching for the semiconductor substrate and forming of each insulating layer. Therefore, there is no need of a separate substrate be bonded to the semiconductor substrate and attachment of this separate substrate to the semiconductor substrate.

In addition, since the pressure sensor manufactured by the above method has the reference pressure chamber within the single semiconductor substrate, it is possible to prevent product costs from increasing due to use of other substrates. In addition, since the reference pressure chamber is defined by a portion of the single semiconductor substrate, the pressure sensor can be made in a small size. Accordingly, this method can manufacture a capacitive pressure sensor, which is capable of reduced deviation of detection precision, low costs and down-sizing, in a simple and convenient manner.

In some embodiments, the method further includes: prior to forming the peripheral insulating layer and the central insulating layer, removing the protective film left in the inner sides of the peripheral through hole and the central through holes by supplying etching gas into the peripheral through hole and the central through holes. For example, if the protective film is formed by plasma CVD (Chemical Vapor Deposition), it has film quality inferior to that of a thermal oxidation film. However, with this method, the peripheral insulating layer and the central insulating layer formed of a thermal oxidation film are formed in the peripheral through hole and the central through holes, respectively, by first cleaning the inner sides of the peripheral through hole and the central through holes by removing the protective film, and then thermally oxidizing the semiconductor substrate, thereby providing the peripheral insulating layer and the central insulating layer having good film quality.

In some embodiments, in the method, the forming the peripheral concave portion and the plurality of central concave portions includes forming the central concave portions by arranging dot-like concave portions into a water droplet pattern and forming the peripheral concave portion by arranging a plurality of dot-like concave portions having the same size as the central concave portions in the form of a ring to surround the closed region with intervals smaller than intervals of adjacent central concave portions, and the forming the peripheral insulating layer and the central insulating layer includes, by the same thermal oxidation, forming the central insulating layer by filling the central through holes constituted by the dot-like central concave portions with a silicon oxide film and forming the peripheral insulating layer by filling the peripheral through hole constituted by the dot-like peripheral concave portions with the silicon oxide film and modifying portions disposed between adjacent peripheral through holes into silicon oxide films such that the silicon oxide films in the adjacent peripheral through holes are interconnected.

With this method, the peripheral insulating layer and the central insulating layer can be formed at once to improve production efficiency. In addition, in the previous step of forming the peripheral insulating layer and the central insulating layer, the peripheral concave portions and the central concave portions are formed to have dots of the same size, which can result in a reduced difference between an etching rate used to form the peripheral concave portions and an etching rate used to form the central concave portions.

Preferably, the forming the peripheral insulating layer and the central insulating layer includes performing thermal oxidation in vacuum.

BRIEF DESCRIPTION OF THE DRAWINGS

FIG. 4E is a view showing a process following the process of FIG. 4D.

FIG. 4F is a view showing a process following the process of FIG. 4E.

FIG. 4G is a view showing a process following the process of FIG. 4F.

FIG. 4H is a view showing a process following the process of FIG. 4G.

DETAILED DESCRIPTION

Figure 1:
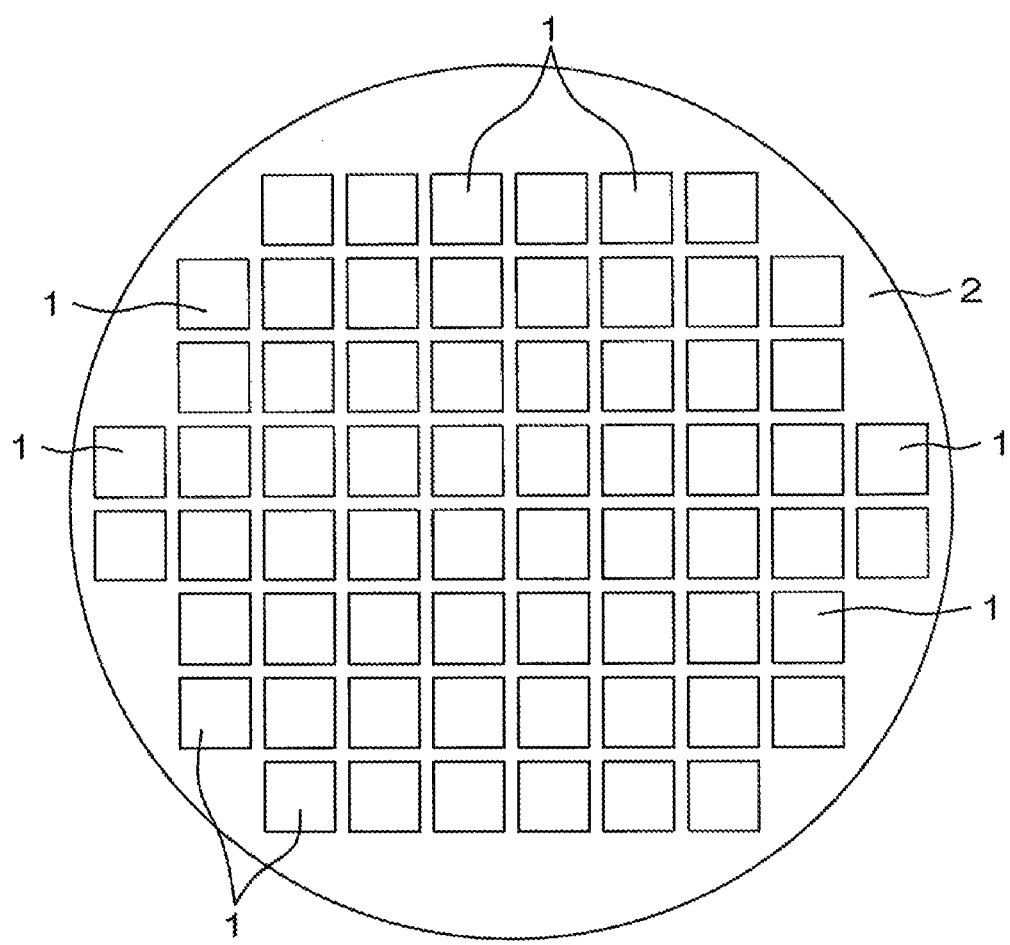
FIG. 1 is a plane view of a silicon wafer used in a process of manufacturing a pressure sensor according to one embodiment of the present disclosure.
Figure 2:
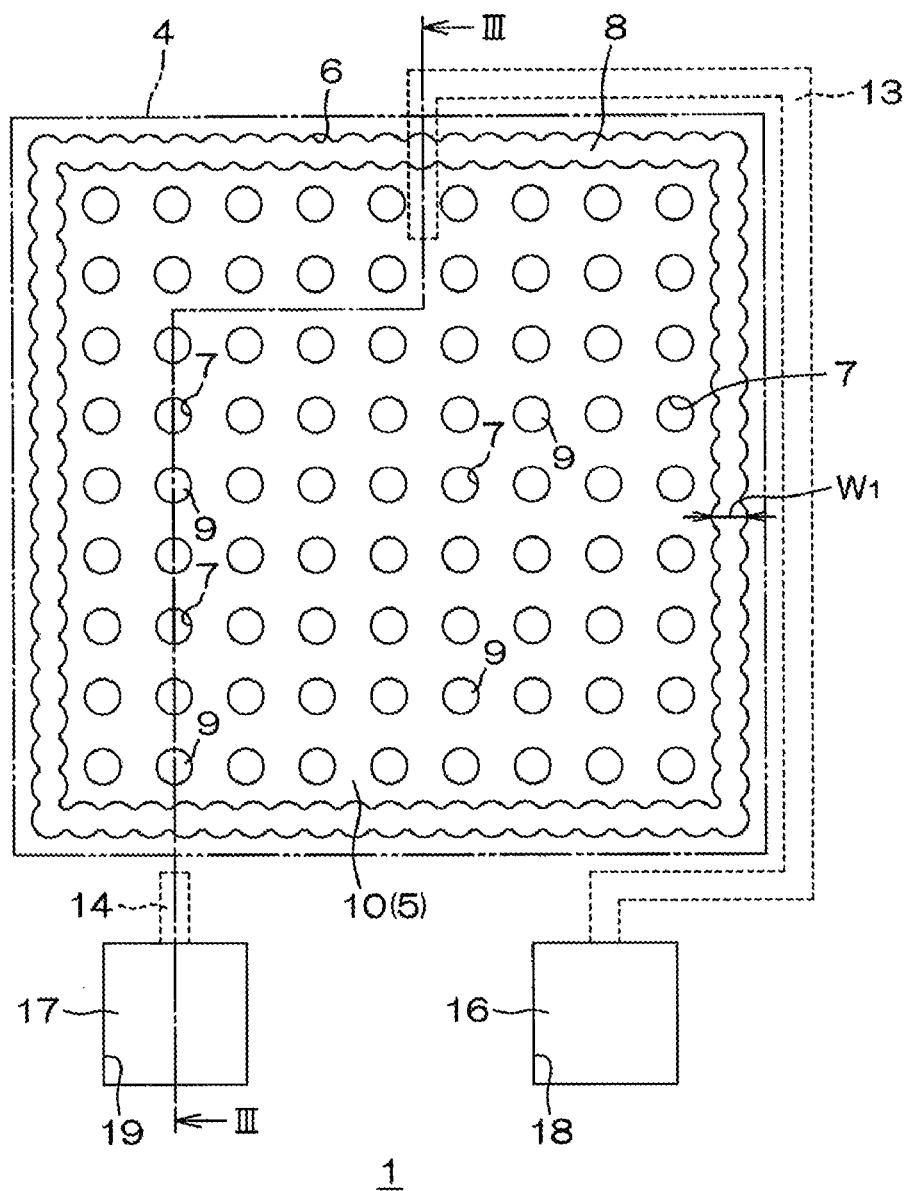
FIG. 2 is a plane view of a pressure sensor according to one embodiment of the present disclosure.
Figure 3:
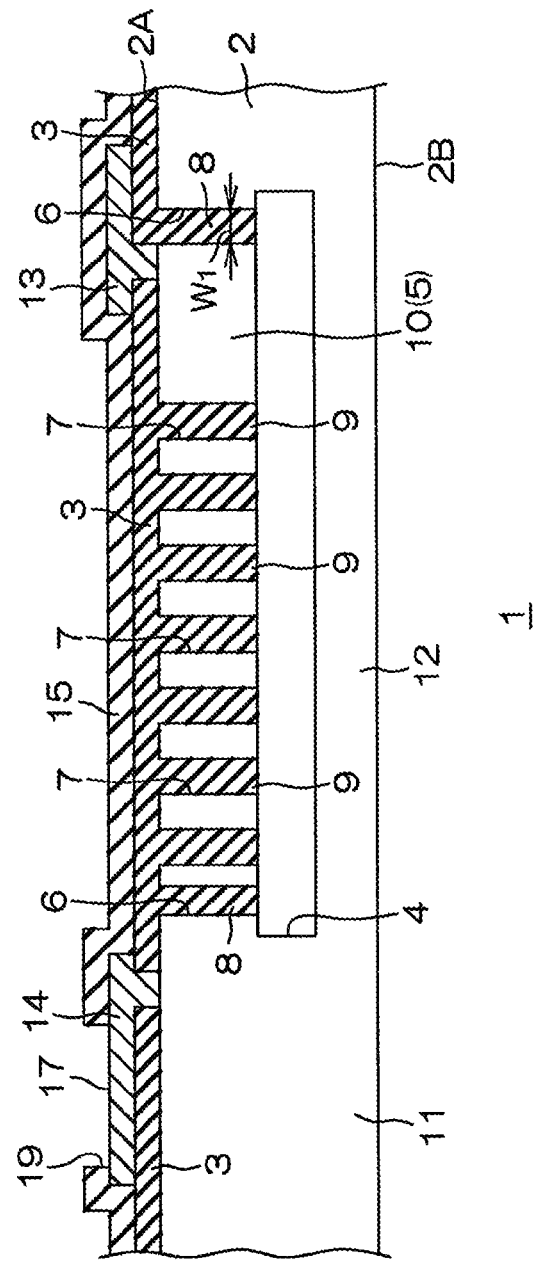
FIG. 3 is a sectional view taken along line III-III in FIG. 2.

Embodiments of the present disclosure will now be described in detail with reference to the drawings. FIG. 1 is a plane view of a silicon wafer used in a process of manufacturing a pressure sensor according to one embodiment of the present disclosure. FIG. 2 is a plane view of a pressure sensor according to one embodiment of the present disclosure. FIG. 3 is a sectional view taken along line III-III in FIG. 2. As shown in FIG. 1, each of a plurality of pressure sensors 1 are a capacitive pressure sensor which detects a variation of pressure based on a variation of capacitance. The plurality of pressure sensors 1 are formed in the regular arrangement in the vertical and horizontal directions on a single silicon wafer 2 (also referred to as a "silicon substrate 2") during manufacture process. In this embodiment, the silicon wafer 2 is formed of as-grown silicon doped with p or n type impurities. The silicon wafer 2 is preferably a low resistance silicon wafer having low specific resistance of, for example, 5 mΩ·cm to 25 mΩ·cm.

Each pressure sensor 1 includes a silicon substrate 2 as a semiconductor substrate. A front surface 2A of the silicon substrate 2 is covered with an interlayer insulating film 3 made of an insulating material such as silicon oxide ($SiO_2$) or the like. A thickness of the interlayer insulating film 3 is 5000 Å to 50000 Å. The interlayer insulating film 3 has a single layered structure but may have a multi-layered structure in other embodiments. A rear surface 2B of the silicon substrate 2 is an exposed surface.

Within the silicon substrate 2, one reference pressure chamber (cavity) 4 is formed for each pressure sensor 1. In this embodiment, the reference pressure chamber 4 has a square shape (rectangular parallelepiped shape in 3D) when viewed from the top as shown in FIG. 2. The reference pressure chamber 4 is a wide and flat space parallel to the front surface 2A of the silicon substrate 2 as shown in FIG. 3. A portion of the silicon substrate 2 facing the reference pressure chamber 4 from a direction of the front surface 2A side is made thinner than the remaining portion of the silicon substrate 2 to define a diaphragm 5. In FIG. 3, for the purpose of convenience, the diaphragm 5 is shown to be thicker than a portion of the silicon substrate 2 at a direction of the rear surface 2B with respect to the reference pressure chamber 4.

The diaphragm 5 is formed with two types of through holes penetrating between the front surface 2A of the silicon substrate 2 and the reference pressure chamber 4. One of the two through holes is a ring-like peripheral through hole 6 formed along an edge of the diaphragm 5 and the other is a plurality of dot-like central through holes 7 arranged in a portion surrounded by the peripheral through hole 6 of the diaphragm 5. In this embodiment, the dot-like central through holes 7 are arranged in a water droplet pattern. More specifically, the central through holes 7 are regularly arranged in the form of a matrix with equivalent intervals along two perpendicular directions when viewed from the top. However, the arrangement pattern of the central through holes 7 is not limited to the matrix form but may be in the form of a zigzag or the like. In this embodiment, a diameter of each central through hole 7 is between, for example, 0.2 μm and 0.5 μm (preferably 0.4 μm).

The peripheral through hole 6 is formed into a slit shape in which a plurality of dots having the same size (for example, 0.2 μm to 0.5 μm in diameter) as each of the dot-like central through holes 7 constituting the water droplet pattern are interconnected to surround the central through holes 7. The slit-shaped peripheral through hole 6 has a wavy contour formed by interconnection of peripherals of the plurality of dots when viewed from the front surface 2A of the silicon substrate 2. This allows a width ($W_1$) of the peripheral through hole 6 to continuously vary, such as to narrow or widen, along the edge of the diaphragm 5.

A peripheral insulating layer 8 and a central insulating layer 9 are buried in the peripheral through hole 6 and the central through holes 7, respectively. In this embodiment, the peripheral insulating layer 8 and the central insulating layer 9 are made of silicon oxide ($SiO_2$). Accordingly, the silicon substrate 2 is divided into a plurality of conductive regions which are electrically isolated from one another by the peripheral insulating layer 8. In this embodiment, the silicon substrate 2 is divided into two regions, where one corresponds to an upper electrode 10 which is disposed in the inner side of the peripheral insulating layer 8 and forms a ceiling of the reference pressure chamber 4, and the other corresponds to a frame 11 which forms a side and a bottom of the reference pressure chamber 4 and supports the upper electrode 10 integrally by the peripheral insulating layer 8. In this pressure sensor 1, the upper electrode 10 is a movable electrode which can be displaced in an opposite direction (thickness direction) to the reference pressure chamber 4. On the other hand, a portion of the frame 11 which faces the upper electrode 10 (i.e., a portion lying under the upper electrode 10) corresponds to a fixed lower electrode 12 with the reference pressure chamber 4 interposed between the upper electrode 10 and the lower electrode 12. A capacitor structure (or condenser) is formed by the upper electrode 10 and the lower electrode 12. In this structure, since the frame 11 is formed to enclose the upper electrode 10 in a lateral direction, both contacts (electrical connection) to the upper electrode 10 and the lower electrode 12 can be taken from the front surface 2A of the silicon substrate 2.

In addition, as all of the peripheral through hole 6 and the central through holes 7 are filled with the peripheral insulating layer 8 and the central insulating layer 9, the reference pressure chamber 4 lying under the diaphragm 5 serves as a sealed cavity whose internal pressure acts as a reference for pressure detection. In this embodiment, the reference pressure chamber 4 remains in a vacuum or pressure-reduced state (for example, $10^{-5}$ Torr). Semiconductor portions of the silicon substrate 2 are exposed at entire inner surfaces (bottom, sides and ceiling surfaces) defining the reference pressure chamber 4 except for the region where the peripheral insulating layer 8 and the central insulating layer 9 are arranged. That is, the reference pressure chamber 4 is defined by the inner surfaces, the most part of which is formed of silicon semiconductor.

A first wiring 13 and a second wiring 14 are formed on the interlayer insulating film 3. In this embodiment, the first wiring 13 and the second wiring 14 are made of aluminum (Al) and are respectively connected to the upper electrode 10 and the frame 11 via the interlayer insulating film 3. In addition, the first wiring 13 and the second wiring 14 are covered by a surface protecting film 15 made of an insulating material such as silicon nitride (SiN). The surface protecting film 15 is formed with openings 18 and 19 to expose portions of the first wiring 13 and the second wiring 14 as a first pad 16 and a second pad 17, respectively. The first pad 16 and the second pad 17 are arranged adjacent to each other along, for example, an edge of the diaphragm 5.

A bias voltage is applied to each of the first and second pads 16 and 17 and a potential difference between the movable electrode (upper electrode 10) and the fixed electrode (lower electrode 12) remains constant. When the diaphragm 5 is subjected to a pressure (e.g., gas pressure) from the front surface 2A of the silicon substrate 2, a difference in pressure between the interior and exterior of the reference pressure chamber 4 is produced to displace the diaphragm 5 in the thickness direction of the silicon substrate 2. Accordingly, a distance between the upper electrode 10 and the lower electrode 12 (i.e., the depth of the reference pressure chamber 4) is varied and a capacitance between the upper electrode 10 and the lower electrode 12 is also varied. A pressure produced in the pressure sensor 1 can be detected based on such a variation of the capacitance.

Figure 4A:
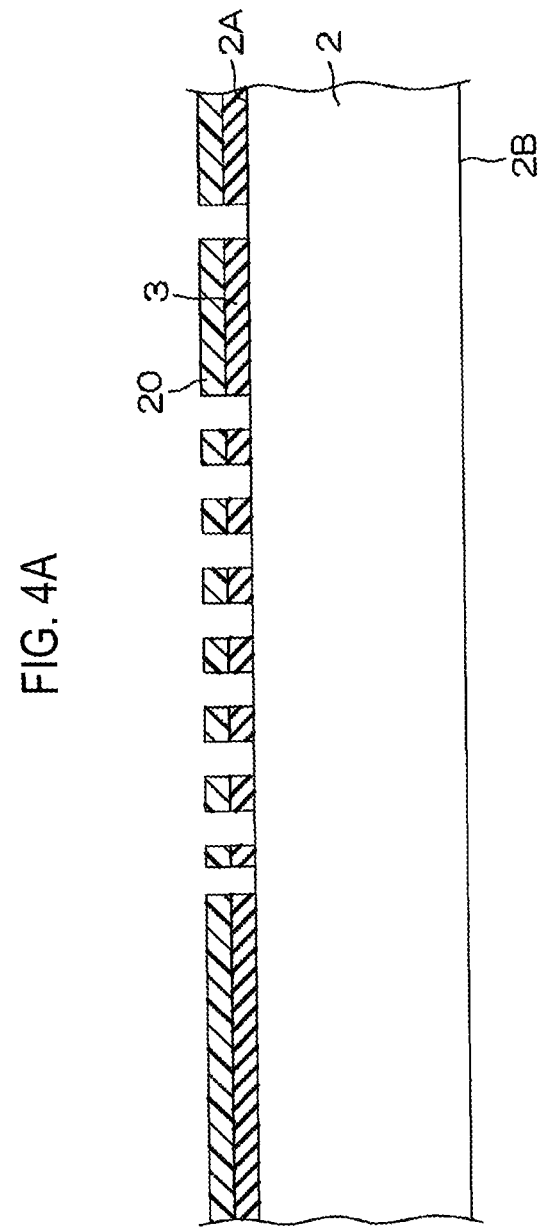
FIG. 4A is a view showing a portion of the process of manufacturing a pressure sensor.

FIGS. 4A to 4J are views showing a sequence of some processes of manufacturing the pressure sensor 1 shown in FIGS. 1 to 3. As shown in FIG. 4A, the interlayer insulating film 3 is formed on the front surface 2A of the silicon substrate 2 (wafer) by thermal oxidation. The interlayer insulating film 3 may be formed by plasma CVD. Subsequently, a resist pattern 20 having a predetermined shape is formed on the interlayer insulating film 3 by photolithography.

Figure 4B:
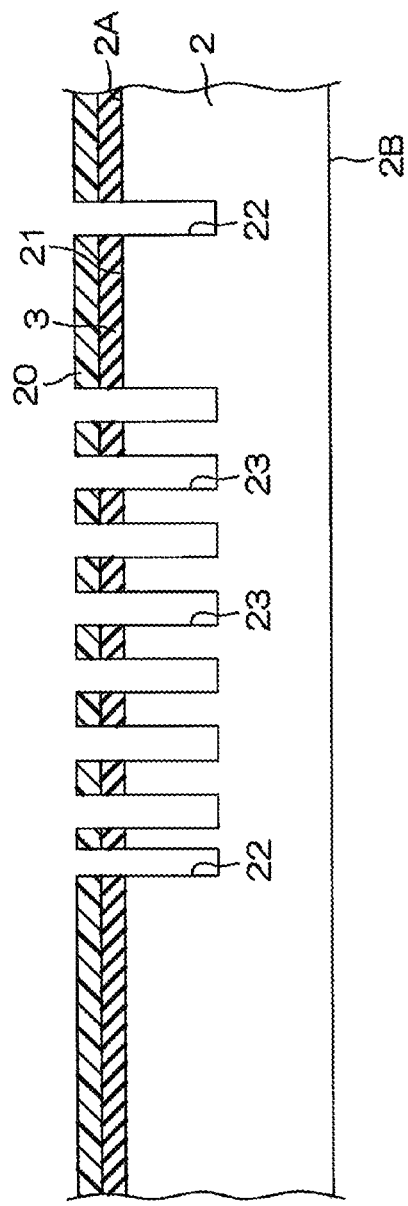
FIG. 4B is a view showing a process following the process of FIG. 4A.
Figure 5A:
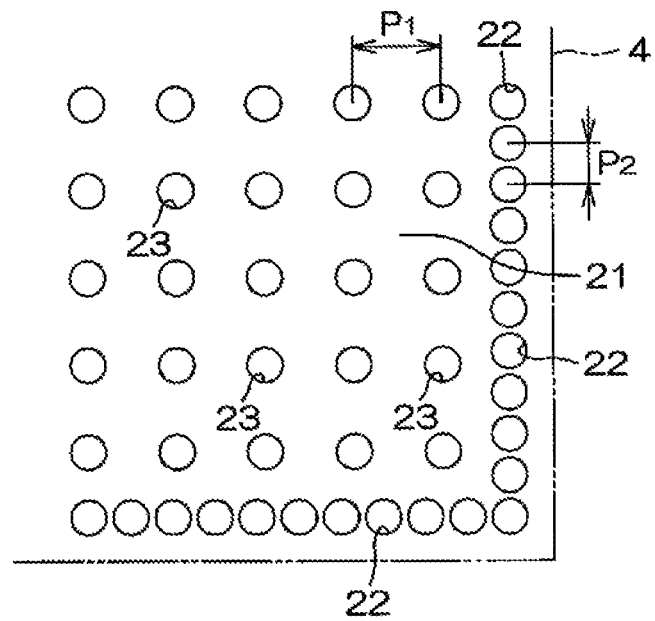
FIGS. 5A and 5B are plan views illustrating a process related to simultaneous formation of a peripheral insulating layer and a central insulating layer.

Subsequently, as shown in FIG. 4B, the silicon substrate 2 is etched by anisotropic deep RIE (Reactive Ion Etching), such as, Bosch process, using the resist pattern 20 as a mask. This provides a plurality of peripheral concave portions 22 in the front surface 2A of the silicon substrate 2 to define a closed region 21 and also provides a plurality of central concave portions 23 in the closed region 21. The closed region 21 is a portion which becomes the upper electrode 10. Specifically, as shown in FIG. 5A, the dot-like central concave portions 23 are arranged into a water droplet pattern (for example, in the form of a matrix or a zigzag), and the peripheral concave portions 22 composed of dots each having the same size as each central concave portion 23 are arranged into a ring shape to surround the closed region 21 with an interval (pitch) ($P_2$) smaller than an interval (pitch) ($P_1$) between adjacent central concave portions 23 ($P_1 > P_2$).

In addition, the Bosch process alternates between a step of etching the silicon substrate 2 using sulphur hexafluoride ($SF_6$) and a step of forming a protective film on an etched surface using perfluorocyclobutane ($C_4F_8$). This forms wavy unevenness, which is called "scallop", on the etched surface (corresponding to the inner peripheral surfaces of the peripheral concave portions 22 and the central concave portions 23), when the silicon substrate 2 is etched at a high aspect ratio. After forming the peripheral concave portions 22 and the central concave portions 23, the resist pattern 20 is peeled off.

Figure 4C:
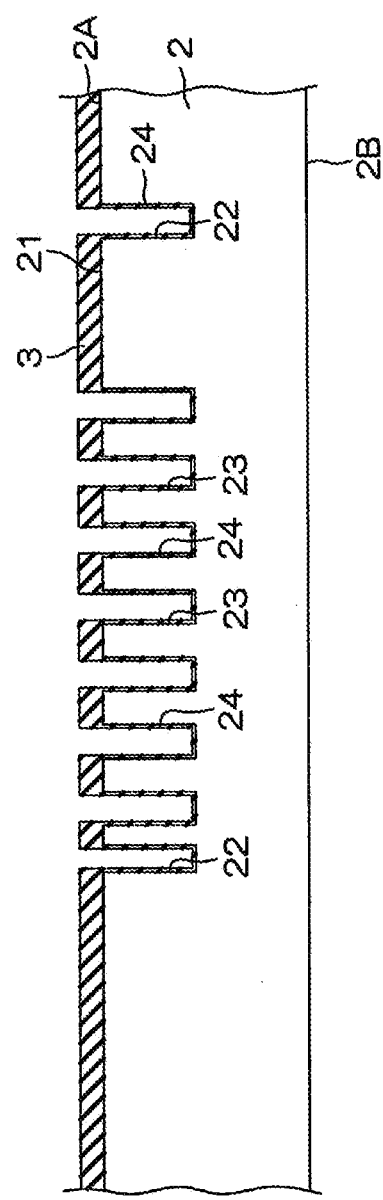
FIG. 4C is a view showing a process following the process of FIG. 4B.

Subsequently, as shown in FIG. 4C, a protective film 24 made of an insulating material such as silicon oxide ($SiO_2$) or the like is formed on the entire inner surfaces of the peripheral concave portions 22 and the central concave portions 23 (i.e., the inner peripheral surfaces and the bottoms of the peripheral concave portions 22 and the central concave portions 23). When the protective film 24 is made of silicon oxide, it is preferably formed using plasma CVD, although it may employ other methods including thermal oxidation of the silicon substrate 2. Differently from the thermal oxidation of the silicon substrate 2, the plasma CVD is not a method of modifying the inner surfaces (portions of the silicon substrate 2) of the peripheral concave portions 22 and the central concave portions 23 into a silicon oxide film. The plasma CVD is a method of depositing a silicon oxide film on the inner surfaces of the peripheral concave portions 22 and the central concave portions 23. Accordingly, an area of a semiconductor portion of the closed region 21 which will result in the upper electrode 10 (a portion other than the peripheral concave portions 22 and the central concave portions 23) can be maintained the same even after the protective film 24 is formed.

Figure 4D:
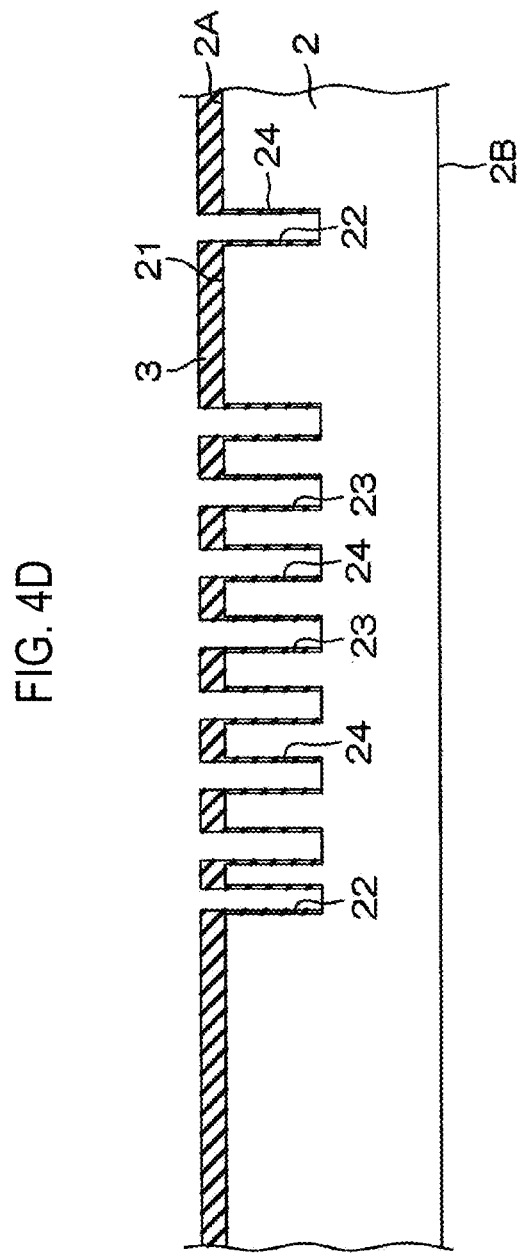
FIG. 4D is a view showing a process following the process of FIG. 4C.

Subsequently, as shown in FIG. 4D, the protective film 24 at the bottom of the peripheral concave portions 22 and the central concave portions 23 is selectively removed by etching. This allows the bottom of the peripheral concave portions 22 and the central concave portions 23 to be exposed. Subsequently, as shown in FIG. 4E, the bottom of the peripheral concave portions 22 and the central concave portions 23 are further etched by anisotropic deep RIE using the interlayer insulating film 3 as a mask. This allows exposure spaces 25 and 26, in which a crystalline plane of the silicon substrate 2 is exposed, to be formed in the bottom of the peripheral concave portions 22 and the central concave portions 23.

Subsequently, as shown in FIG. 4F, reactive ions and etching gas are supplied into the exposure spaces 25 and 26 of the peripheral concave portions 22 and the central concave portions 23 by isotropic RIE. Then, the silicon substrate 2 is etched in a direction parallel to the front surface 2A of the silicon substrate 2 while being etched in the thickness direction of the silicon substrate 2, starting from the exposure spaces 25 and 26, by reaction of the reactive ions. This allows all adjacent exposure spaces 25 and 25 to be integrated such that the reference pressure chamber 4 is formed inside the silicon substrate 2 and the diaphragm 5 is formed in the front surface 2A side with respect to the reference pressure chamber 4. In addition, with the reference pressure chamber 4 formed so, the peripheral concave portions 22 and the central concave portions 23 become peripheral through holes 6 and central through holes 7 penetrating between the front surface 2A of the silicon substrate 2 and the reference pressure chamber 4, respectively. In addition, the silicon substrate 2 is partitioned into the upper electrode 10 composed of the closed region 21 and the frame 11.

Subsequently, as shown in FIG. 4G, the protective film 24 left in the inner surfaces of the peripheral through holes 6 and the central through holes 7 is removed by supplying etching gas into the peripheral through holes 6 and the central through holes 7. An example of the etching gas may include hydrofluoric acid (HF). This allows the inner surfaces of the peripheral through holes 6 and the central through holes 7 to become a crystalline plane where the silicon substrate 2 is exposed. Since the protective film 24 is formed by the plasma CVD as described above, it has film quality lower than that of a thermal oxide film. Here, as shown in FIG. 4G, once the inner surfaces of the peripheral through holes 6 and the central through holes 7 are cleaned by removing the protective film 24, a peripheral insulating layer 8 and a central insulating layer 9, each formed of a thermal oxide film, can be formed in the peripheral through holes 6 and the central through holes 7, respectively, in the subsequent process. This can provide good film quality of the peripheral insulating layer 8 and the central insulating layer 9.

Figure 5B:
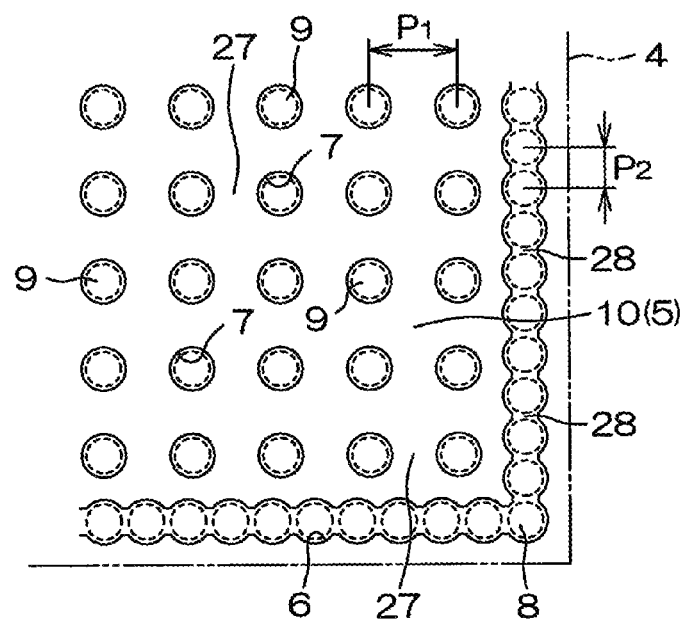

Subsequently, as shown in FIG. 4H, the peripheral insulating layer 8 and the central insulating layer 9 are formed simultaneously by thermally oxidizing the silicon substrate 2 (for example, for 24 hours at 1100 to 1150 degrees C.) in vacuum, for example. More specifically, as shown in FIG. 5B, when the silicon substrate 2 is thermally oxidized, a portion of the diaphragm 5 is modified into a silicon oxide film in a concentric form from the periphery of the peripheral through holes 6 and the central through holes 7, while the silicon oxide film is being thermally expanded to fill in the peripheral through holes 6 and the central through holes 7. In FIG. 5B, circles indicated by broken lines represent contours of the peripheral through holes 6 and the central through holes 7 present before forming the peripheral insulating layer 8 and the central insulating layer 9.

In this thermal oxidation, since the pitch ($P_1$) of the central through holes 7 is larger than the pitch ($P_2$) of the peripheral through holes 6, time taken for a silicon oxide film widened outwardly from a central through hole 7 to meet a silicon oxide film widened outwardly from an adjacent central through hole 7 can be set to be longer than time taken for a silicon oxide film widened outwardly from a peripheral through hole 6 to meet a silicon oxide film widened outwardly from an adjacent peripheral through hole 6. This allows a semiconductor portion 28 disposed between the adjacent peripheral through holes 6 to be modified into a silicon oxide film, while allowing a semiconductor portion 27 disposed between the adjacent central through holes 7 to be left in a silicon state, thereby enabling interconnection of silicon oxide films in the adjacent peripheral through holes 6. This can result in a slit-shaped peripheral insulating layer 8 having a wavy contour formed by interconnection of circumferences of the plurality of dots.

Such simultaneous formation of the peripheral insulating layer 8 and the central insulating layer 9 can result in the improvement of production efficiency. In addition, in the previous step (see FIG. 5A) of forming the peripheral insulating layer 8 and the central insulating layer 9, the peripheral concave portions 22 and the central concave portions 23 are formed to have dots of the same size, which can result in a reduced difference between an etching rate used to form the peripheral concave portions 22 and an etching rate used to form the central concave portions 23.

Figure 4I:
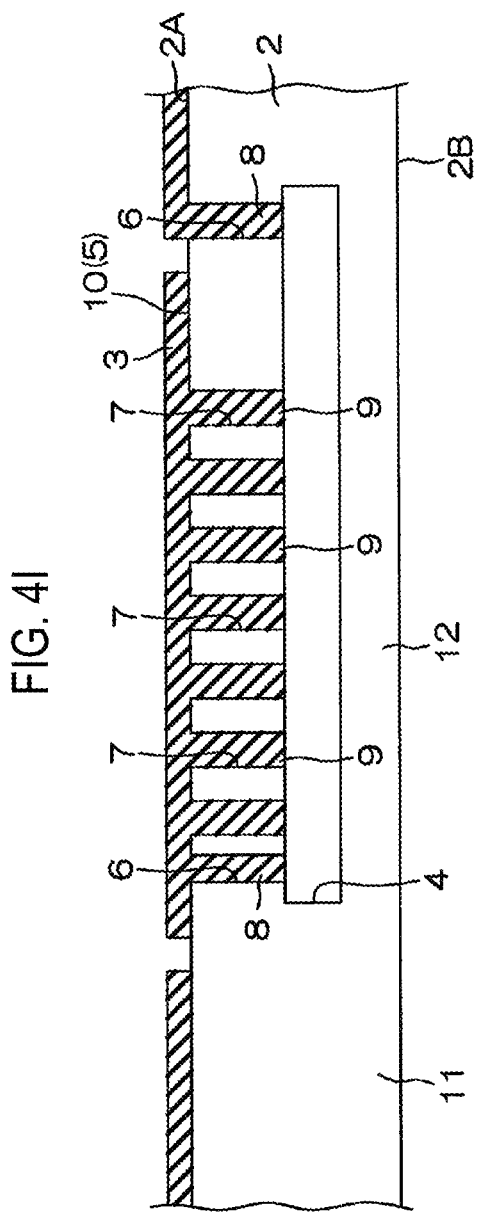
FIG. 4I is a view showing a process following the process of FIG. 4H.

Subsequently, as shown in FIG. 4I, the interlayer insulating film 3 is selectively removed by, for example, plasma etching to selectively expose portions of the upper electrode 10 and the frame 11. In addition, prior to this process, the interlayer insulating film 3 may be thinned by, for example, etching, CMP (Chemical Mechanical Polishing) or the like.

Figure 4J:
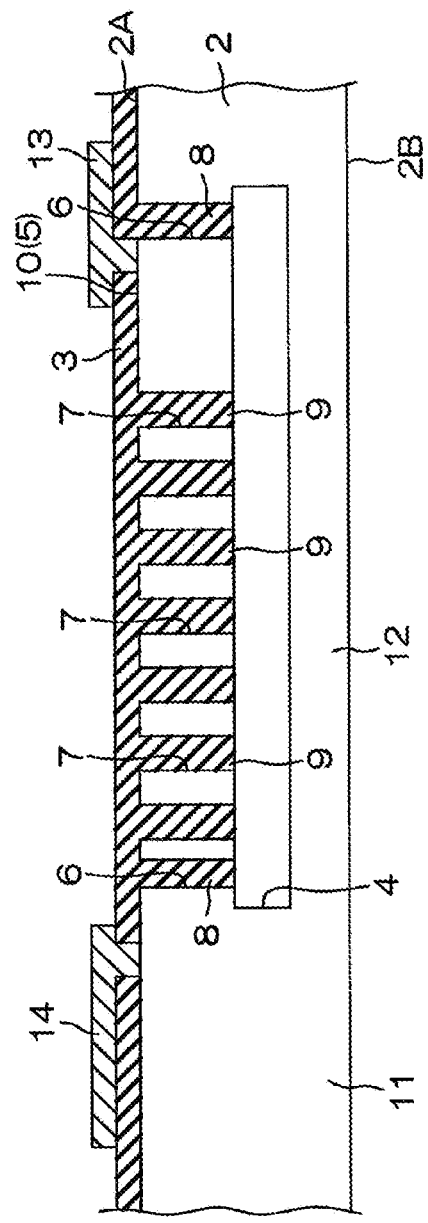
FIG. 4J is a view showing a process following the process of FIG. 4I.

Subsequently, as shown in FIG. 4J, a first wiring 13 and a second wiring 14 are formed on the interlayer insulating film 3. Thereafter, the pressure sensor 1 having the structure shown in FIG. 3 can be obtained by forming a surface protecting film 15, openings 18 and 19 and so on. According to the above-described method, by forming the peripheral concave portions 22 and the central concave portions 23 on the silicon substrate 2 by anisotropic deep RIE (FIGS. 4B and 5A) and then performing anisotropic deep RIE and isotropic RIE consecutively (FIGS. 4E and 4F), it is possible to form the reference pressure chamber 4 within the silicon substrate 2 and at the same time form the diaphragm 5. In addition, all through holes 6 and 7 can be blocked by filling the peripheral through holes 6 and the central through holes 7 with the peripheral insulating layer 8 and the central insulating layer 9, respectively. As a result, the reference pressure chamber 4 can be sealed to be maintained at a reference pressure (for example, vacuum) for pressure detection.

In other words, according to the manufacturing method of this embodiment, only the silicon substrate 2 may be subjected to several processes such as deep RIE and thermal oxidation to form the reference pressure chamber 4, without a need for a separate substrate (for example, a glass substrate or the like) to be bonded to the silicon substrate 2 and attachment of this separate substrate to the silicon substrate 2. The pressure sensor 1 manufactured by this method has the reference pressure chamber 4 within a single silicon substrate 2, which can prevent a cost increase due to the use of other substrates. In addition, the reference pressure chamber 4 can be made in a small size since it is defined by a single silicon substrate 2. Accordingly, this embodiment can provide a small-sized pressure sensor 1 which can be manufactured with low costs and simplicity. In addition, a substrate used in the embodiment is an inexpensive material such as the silicon substrate 2, which can result in further reduction in costs incurred for substrate.

The pressure sensor 1 is of a capacitive type to detect a pressure applied to the diaphragm 5 based on a variation in capacitance between the upper electrode 10 and the lower electrode 12. In other words, since a piezo-resistive element susceptible to a change in the ambient temperature is not used for the present disclosure, it is possible to decrease a deviation in detection precision under varying ambient temperature. In addition, the ceiling of the reference pressure chamber 4 (that is, the bottom of the upper electrode 10 which faces the lower electrode 12) is not covered by an insulating film but is exposed as a silicon semiconductor. Accordingly, it is possible to prevent the upper electrode 10 from being electrified when the upper electrode 10 contacts the lower electrode 12.

In addition, since the interior of the reference pressure chamber 4 remains vacuous, it is possible to prevent the internal pressure of the reference pressure chamber 4 from being changed due to a change in ambient temperature, which can result in improvement of pressure detection precision of the pressure sensor 1.

While the present disclosure has been shown and described by way of certain embodiments, the present disclosure can be practiced with other embodiments. For example, although an example of forming the pressure sensor 1 on a single silicon substrate 2 (silicon wafer 2) has been illustrated in the above embodiments, a substrate serving as a base for the pressure sensor 1 may be a semiconductor substrate or the like having an insulating layer interposed between a lower semiconductor layer and an upper semiconductor layer, such as a SOI (Silicon On Insulator) substrate. In this case, the reference pressure chamber 4 may be formed by digging the lower semiconductor layer, for example.

In addition, although it has been illustrated in the above embodiments that the peripheral insulating layer 8 and the central insulating layer 9 are formed by the same thermal oxidation, these insulating layers may be separately formed by their respective thermal oxidations. In addition, as long as the peripheral insulating layer 8 and the central insulating layer 9 can have a shape to seal the reference pressure chamber 4, the peripheral through holes 6 and the central through holes 7 may not be necessary to be filled as in the above embodiments.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A capacitive pressure sensor comprising:
    a semiconductor substrate having a reference pressure chamber formed therein and having a front surface at one side of the reference pressure chamber and a rear surface at the other side of the reference pressure chamber;
    a diaphragm formed at the front surface of the semiconductor substrate, and having a ring-like peripheral through hole and a plurality of central through holes, the ring-like peripheral through hole penetrating between the front surface of the semiconductor substrate and the reference pressure chamber and defining an upper electrode constituted by a portion of the diaphragm surrounded by the ring-like peripheral through hole, and the plurality of central through holes penetrating between the front surface of the semiconductor substrate and the reference pressure chamber;

a peripheral insulating layer which is disposed within the peripheral through hole and fills the peripheral through hole to electrically isolate the upper electrode from other portions of the semiconductor substrate; and a central insulating layer which is disposed within the central through holes and fills the central through holes, wherein the central through holes are arranged into a water droplet pattern, wherein the peripheral through hole is formed into a slit shape in which a plurality of dots having the same size as each of the dot-like central through holes constituting the water droplet pattern are interconnected to surround the upper electrode, and wherein the slit-shape peripheral through hole has a wavy contour formed by interconnection of the peripheries of the plurality of dots when viewed from the front surface of the semiconductor substrate.

2. The capacitive pressure sensor of claim 1, wherein a semiconductor portion of the upper electrode other than a portion where the central insulating layer is disposed is exposed to a ceiling of the reference pressure chamber.

3. The capacitive pressure sensor of claim 1, wherein the semiconductor substrate is made of silicon.

4. The capacitive pressure sensor of claim 3, wherein the central insulating layer and the peripheral insulating layer are made of silicon oxide.

5. The capacitive pressure sensor of claim 1, further comprising:

a first wiring connected to the upper electrode; and a second wiring connected to a portion of the semiconductor substrate other than the upper electrode.

6. The capacitive pressure sensor of claim 1, wherein the interior of the reference pressure chamber is a sealed space.

7. A method of manufacturing a capacitive pressure sensor, comprising:

selectively forming a ring-like peripheral concave portion defining a closed region and a plurality of central concave portions disposed within the closed region at a front surface of a semiconductor substrate made of silicon;

forming a protective film made of silicon oxide on each of inner sides of the peripheral concave portion and the central concave portions;

selectively removing portions of the protective film on a bottom of the peripheral concave portion and the central concave portions;

digging the peripheral concave portion and the central concave portions by anisotropic etching, forming a reference pressure chamber by interconnecting lower portions of the peripheral concave portion and the plurality of central concave portions by isotropic etching, and forming a diaphragm including an upper electrode constituted by the closed region at a portion of the front surface of the semiconductor substrate disposed in a front surface side with respect to the reference pressure chamber;

forming a peripheral insulating layer made of silicon oxide, which fills a peripheral through hole constituted by the peripheral concave portion penetrating between the front surface of the semiconductor substrate and the reference pressure chamber and electrically isolates the upper electrode from other portions of the semiconductor substrate by thermally oxidizing the semiconductor substrate; and forming a central insulating layer made of silicon oxide, which fills central through holes constituted by the central concave portions penetrating between the front surface of the semiconductor substrate and the reference pressure chamber by thermally oxidizing the semiconductor substrate.

8. The method of claim 7, further comprising: prior to forming the peripheral insulating layer and the central insulating layer, removing the protective film left in the inner sides of the peripheral through hole and the central through holes by supplying etching gas into the peripheral through hole and the central through holes.

9. The method of claim 7, wherein the forming the peripheral concave portion and the plurality of central concave portions includes forming the central concave portions by arranging dot-like concave portions into a water droplet pattern and forming the peripheral concave portion by arranging a plurality of dot-like concave portions having the same size as the central concave portions in the form of a ring to surround the closed region with intervals smaller than intervals of adjacent central concave portions, and wherein the forming the peripheral insulating layer and the central insulating layer includes, by the same thermal oxidation, forming the central insulating layer by filling the central through holes constituted by the dot-like central concave portions with a silicon oxide film and forming the peripheral insulating layer by filling the peripheral through hole constituted by the dot-like peripheral concave portions with the silicon oxide film and modifying portions disposed between adjacent peripheral through holes into silicon oxide films such that the silicon oxide films in the adjacent peripheral through holes are interconnected.

10. The method of claim 7, wherein the forming the peripheral insulating layer and the central insulating layer includes performing thermal oxidation in vacuum.

\* \* \* \* \*